June 11, 1968 F. G. LEE 3,388,337

HYBRID BALANCED PUSH-PULL AMPLIFIER

Filed Nov. 24, 1964

INVENTORS
Franklin G. Lee and
Harold A. Male.
BY Ernest P. Klipfel
ATTORNEY

United States Patent Office 3,388,337
Patented June 11, 1968

3,388,337
HYBRID BALANCED PUSH-PULL AMPLIFIER
Franklin G. Lee, Baltimore, and Harold A. Male, Glen Burnie, Md., assignors to Westinghouse Electric Corporation, Pittsburgh, Pa., a corporation of Pennsylvania
Filed Nov. 24, 1964, Ser. No. 413,585
7 Claims. (Cl. 330—15)

ABSTRACT OF THE DISCLOSURE

A hybrid balanced push-pull amplifier wherein hybrid isolation of the source and load is obtained by the use of a proper impedance between the center tap of a balanced transformer and ground on the input as well as the output sides of a push-pull pair of transistors. The isolating impedance in both instances is selected to have a value substantially equal to the square of the turns ratio of its associated transformer times the magnitude of its associated source or load impedance divided by four. Alternatively a multicore hybrid with terminating impedances matched to the source or load impedance provides isolation for a push-pull amplifier across a wide band.

The invention relates to amplifier apparatus for electrical signals, and more particularly to balanced push-pull amplifier adapted to utilize transistors having wide variation in their respective operating characteristics.

The use of wide band electronic receiving devices such as antenna couplers and preamplifiers requires the use of apparatus where a high degree of even order distortion cancellation is obtained for all combinations of signal frequencies. Apparatus presently known to those skilled in the art have used vacuum tubes in pairs or distributed configurations with reasonably good satisfaction. The input and output impedances of vacuum tubes, however, are comparatively high in the RF range of frequencies in comparison to the circuit source and load impedance and only small variations in parameters between tubes need to be adjusted for good even order distortion reduction. In vacuum tube circuits, moreover it is a common practice to ground the source and the center tap of the load transformer which are at very low signal voltages. As technology has progressed into solid state design and utilization, however, it has been found that wide band balance cannot be easily obtained where one or more pairs of medium power transistors are operated in push-pull relationship. This difficulty arises from the relatively wide variation in the operation characteristics of a selected transistor type.

It has been discovered that the use of an "isolated" source and load in combination with a push-pull transistor amplifier will permit wide band balance adjustment even when transistor parameters are substantially different.

It is an object of the present invention, therefore to provide an improved amplifier for the wide band amplification of electrical signals.

It is still another object of the present invention to provide a push-pull amplifier providing improved balanced operation over a wide band of signal frequencies.

It is still another object of the present invention to provide an improved transistor push-pull amplifier wherein wide band balance is achieved even though transistors are used whose operating parameters are substantially different.

Briefly the subject invention contemplates the use of a pair of semiconductor signal translation devices, such as transistors, operated in push-pull relationship between a signal source and a load with signals being coupled from the source and to the load by means of a hybrid coil network with each hybrid coil network being terminated by a selected impedance so that a high degree of isolation is achieved between the pair of signal translation devices, so that variations in the operating characteristics of one device will not affect the operation of the other.

Other objects and advantages will become readily apparent from a reading of the following detailed specification when considered in connection with the accompanying drawings in which.

Figure 1:
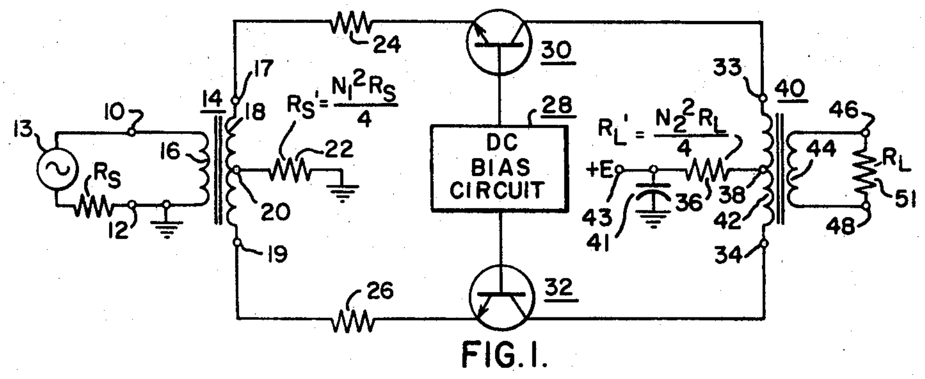
FIGURE 1 is an electrical schematic diagram of one embodiment of the subject invention.

Referring now to FIGURE 1 there is shown a source of electrical signals 13 having a source impedance $R_s$ adapted to be coupled to the input terminals 10 and 12. Terminal 12 moreover is connected to a point of common reference potential hereinafter referred to as "ground." Across the input terminals 10 and 12 is coupled the primary winding 16 of a first transformer 14 whose secondary winding 18 has a center tap 20. The transformer 14 is preferably a balanced transformer, i.e., a transformer whose secondary winding has a center tap with the number of turns on each side of the center tap being equal in number. Furthermore, the center tap is normally returned to ground.

Continuing with the description of FIGURE 1, the secondary winding 18 is adapted to have a pair of intermediate terminals 17 and 19 connected to opposite ends of the winding. Connected to the center tap 20 is a resistive impedance $R_s'$ designated by the reference numeral 22. The resistance $R_s'$ is connected to ground. The value of the resistance $R_s'$ is selectively chosen as will be shown subsequently, to properly terminate the secondary winding 18 thereby providing a high degree of isolation between terminals 17 and 19, so that a change occurring at either terminal will have relatively little effect on the other. When a balanced transformer such as illustrated in FIGURE 1 is properly terminated at its center tapped secondary winding, it becomes what is commonly referred to in the art as a "hybrid network." The proper value of the termination impedance $R_s'$ for the transformer 14 is determined by the following relationship:

$$R_s' = \frac{N_1^2 R_s}{4} \quad (1)$$

where $N_1$ is the turns ratio ($n_p/n_s$) of transformer 14, and $R_s$ is the value of the source impedance of signal source 13.

Transistors 30 and 32 are coupled by means of a pair of input matching resistors 24 and 26 to intermediate terminals 17 and 19 respectively. For purposes of illustration, transistors 30 and 32 are shown connected in what is commonly referred to as a common base configuration such that their respective base electrodes are connected to a D.C. bias circuit 28 and the signal inputs are applied to the respective emitter electrodes. This is achieved by connecting resistor 24 from terminal 17 to the emitter electrode of transistor 30 and by connecting resistor 26 from terminal 19 to the emitter electrode of transistor 32. The D.C. bias circuit 28 can be of any desired configuration which will provide proper bias potentials to the bases of transistors 30 and 32 so that proper operation is achieved.

The output circuit of the embodiment shown in FIGURE 1 comprises another hybrid coil network comprising a second transformer 40 coupled to the collector electrodes of transistors 30 and 32. The second transformer 40 has its primary winding 44 coupled to output terminals 46 and 48. The secondary winding 42 has a center tap 38 and the ends of the winding 42 connect a second pair of intermediate terminals 33 and 34 such that terminal 33 is directly connected to the collector electrode of transistor 30 and terminal 34 is directly connected to the collector electrode of transistor 32. A second resistive impedance $R_L'$ designated by reference numeral 36 is connected at one end to the center tap 38 while the other end is connected to terminal 43 to which is applied a positive source of supply potential from a power supply not shown. An RF bypass capacitor 41 is connected from terminal 43 to ground to prevent any high frequency signals from being fed back into the power supply.

Transformer 40 is similar to transformer 14 in that it is a balanced transformer. The resistive impedance $R_L'$ is a terminating resistance of a selected value to properly terminate the winding 42 rendering the circuit combination a hybrid network such that high degree of isolation is achieved between the second pair of intermediate terminals 33 and 34. The isolation is achieved when the terminating impedance $R_L'$ is chosen according to the following relationship:

$$R_L' = \frac{N_2^2 R_L}{4} \qquad (2)$$

where $N_2$ is the turns ratio $(n_p/n_s)$ of transformer 40 and $R_L$ is equal to the load impedance 51 which is adapted to be connected across the output terminals 46 and 48.

When an input signal is applied across the input terminals 10 and 12 from the signal source 13 the center tapped secondary winding 18 will cause input signals of opposite polarity to be simultaneously fed to the emitter electrodes of transistors 30 and 32 respectively such that one transistor, for example transistor 30, will operate on positive polarity signals applied across input terminals 10 and 12 while transistor 32 will operate with respect to negative polarity signals applied across terminals 10 and 12. Hence, transistors 30 and 32 operate alternately to give rise to what is commonly referred to as a push-pull operation. The amplified signals are impressed across terminals 33 and 34 and since the center tap 38 is returned to ground through the terminating resistance $R_L'$ and the supply source, not shown, an amplified output signal will appear across winding 44 corresponding to the input signal but amplified. The resistances 24 and 26 are utilized in conjunction with the input impedance of the transistors to provide a matched secondary load on transformer 14. By terminating the first and second hybrid network with the proper impedance $R_s'$ and $R_L'$ according to Equations 1 and 2 respectively, a high degree of isolation is achieved between the intermediate terminals 17 and 19, and 33 and 34 respectively. From this it can be seen that the transistors 30 and 32 can differ considerably in operation characteristics without affecting one another. Furthermore, it has been experimentally observed that isolation on the order of 15 to 20 decibels (db) can be obtained between terminals 17 and 19, and 33 and 34 by means of a single resistance terminating transformers 14 and 40 respectively according to the teachings of the present invention.

Figure 2:
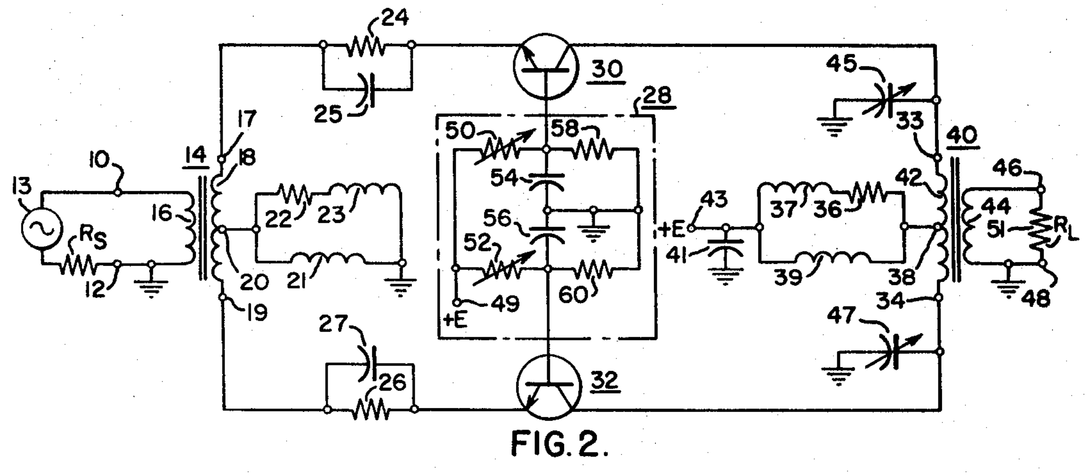
FIG. 2 is a schematic electrical diagram of another embodiment of the subject invention.

When improved isolation across a wide band of frequencies, for example 2 to 32 megacycles (mc.), is desirable, an embodiment substantially as shown in FIGURE 2 can be utilized without departing from the spirit and scope of the present invention. Shown is a pair of input terminals 10 and 12 which is connected to the primary winding 16 of transformer 14. The secondary winding 18 includes a center tap 20 and the ends of the winding are terminated in the first pair of intermediate terminals 17 and 19. A terminating impedance network is connected from the center tap 20 to ground and comprises a resistance-inductance circuit combination comprising resistor 22 connected in series to inductor 23 with these two components being shunted by inductor 21. Coupled between the emitter electrode of transistor 30 and first intermediate terminal 17 is a parallel resistor-capacitor combination comprising resistor 24 and capacitor 25. Similarly with respect to transistor 32 the emitter electrode is coupled to the first intermediate electrode 19 by means of the parallel resistor-capacitor combination comprising resistor 26 and capacitor 27. The base electrodes of transistors 30 and 32 are connected to a D.C. bias circuit 28 shown in greater detail as a first voltage divider network comprising adjustable resistor 50 and fixed resistor 58 connected between terminal 49 which is adapted to be connected to supply potential +E from a power supply, not shown, and ground with the base electrode of transistor 30 being connected between the common terminal between resistor 50 and resistor 58. Connected to the base electrode of transistor 30 is a bypass capacitor 54 returned to ground. A second voltage divider network comprising variable resistor 52 and fixed resistor 60 is coupled between terminal 49 and ground with the common connection therebetween connected to base electrode of transistor 32. Capacitor 56 is adapted to have one terminal connected to the base of transistor 32 while the other terminal is returned to ground. The collector electrode of transistor 30 is connected to terminal 33 while the collector electrode of transistor 32 is connected to terminal 34. Similarly with respect to the embodiment shown in FIGURE 1 a second hybrid coil network comprising the balanced transformer 40 is coupled to the collector electrodes of transistors 30 and 32. The transformer 40 has its primary winding 44 connected to the output terminal 46 and 48 while the secondary winding 42 connects to the second intermediate terminals 33 and 34. The center tap 38 of transistor 42 is terminated by a second terminating impedance network comprising an inductance-resistance combination comprising resistor 36 connected in series to inductor 37 across which is connected inductor 39. The opposite end of this terminating impedance network is directly connected to terminal 43 which is adapted to receive a supply potential +E from a power supply, not shown, for the collectors of transistors 30 and 32. A bypass capacitor 41 is connected from terminal 43 to ground for preventing any signal frequencies from being fed back into the power supply. Additionally, variable capacitors 45 and 47 are connected from intermediate terminals 33 and 34 respectively to ground and are utilized as trimming capacitors for the output circuit.

Whereas the terminating impedence of the embodiment shown in FIGURE 1 comprises a single resistive impedance $R_s'$ and $R_L'$ having values selectively chosen according to Equations 1 and 2 respectively, the terminating impedance of the embodiment shown in FIGURE 2 also still include resistance elements 22 and 36 in the first and second hybrid coil network, respectively. It should be noted that resistance 22 still represents $R_s'$ and resistor 36 corresponds to $R_L'$ with both values still being selected according to Equations 1 and 2 respectively. Regarding the first or input circuit terminating impedance, the inductor 23 is used for high frequency compensation to compensate for transformer leakage of transformer 14 thus giving better high band isolation while inductor 21 is used to compensate for transformer shunt inductance as well as providing a low resistance bypass for emitter current of transistors 30 and 32. Likewise with regard to the second or output circuit terminating impedance, the inductor 37 compensates for transformer leakage of transformer 40 while inductor 39 provides a low D.C. path for collector current for the transistors 30 and 32. The resistor 24 and capacitor 25 combination provide high frequency gain compensation for one leg of the amplifier stage comprising the transistor 30 whereas the resistor 26 and capacitor 27 combination provides high frequency gain compensation for the other leg of the amplifier comprising transistor 32.

By proper selection of resistance 22 according to Equation 1 as well as the values of inductors 23 and 21 isolation in the order of 35 to 40 db can be readily obtained. The same considerations are true with respect to the second terminating impedance comprising resistance 36 being selected according to Equation 2 as well as proper value selection of inductors 37 and 39. As has been pointed out with respect to the embodiment shown in FIGURE 1 when any variation is made on one side of the balanced circuit, the opposite side is essentially unaffected. A wide range of impedance and therefore a corresponding signal change can be made at terminal 17 with little variation to terminal 19. For example, the impedance seen at terminal 17 looking back into transformer 14 is a function of $R_s$ and the center tap impedance connected thereto and is therefore independent of loading at terminal 19.

Figure 3:
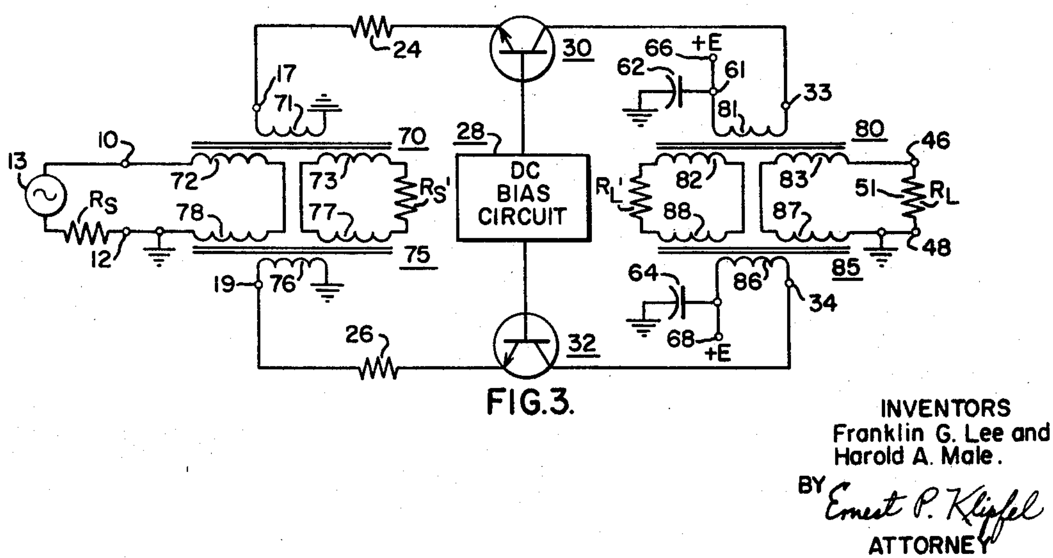
FIG. 3 is an electrical schematic diagram of still another embodiment of the subject invention.

FIGURE 3 illustrates another embodiment of the subject invention which utilizes multicoil hybrid networks each comprising a two-core hybrid. More particularly, the first hybrid networks comprises a hybrid 70 operably connected to the hybrid 75 in the following manner: A first winding 72 and 78 of hybrids 70 and 75, respectively, are connected in series across the input terminals 10 and 12 to which is applied a signal source 13 having an internal impedance $R_s$. A second winding 73 and 77 of hybrids 70 and 75, respectively, are connected in series of a terminating impedance $R_s'$. A third winding 71 of hybrid 70 has one end connected to ground and the opposite end is connected to the first intermediate terminal 17. A third winding 76 of hybrid 75 has one end connected to ground while the opposite end thereof is connected to the intermediate terminal 19.

The remainder of the circuitry of the embodiment shown in FIGURE 3 is in all respects similar to the embodiment shown in FIGURE 1 with the exception that the second hybrid network comprises a two-core hybrid similar to the one described with respect to the input. The second hybrid network comprises hybrid circuits 80 and 85 interconnected in the following manner. A first winding 83 and 87 of hybrids 80 and 85, respectively, are connected in series to the output terminals 46 and 48 which is adapted to be connected to the load $R_L$. A second winding 82 and 88 of hybrids 80 and 85, respectively, are connected in series to a second terminating impedance $R_L'$. A third winding 81 of hybrid circuit 80 has one end connected to the second intermediate terminal 33 while the opposite end thereof is coupled to terminal 61 with 66 which is adapted to receive a source of collector's supply potential +E from a source not shown. Also connected thereto is an RF bypass capacitor 62. Also a third winding 86 of hybrid circuit 85 has one end connected to the second intermediate terminal 34 while the opposite end is connected to terminal 68 which is also adapted to receive a collector supply potential +E from a source not shown for transistor 32. Also connected thereto is a second bypass capacitor 64.

The terminating impedances $R_s'$ and $R_L'$ with respect to the embodiment shown in FIGURE 3 can also be selected when desired according to the relationships specified in Equations 1 and 2 respectively; however, inasmuch as hybrid networks of the types shown in FIGURE 3 utilize 1:1 turns ratio transformers it is sufficient to make $R_s'=R_s$ as well as $R_L'=R_L$ for proper termination.

The embodiment shown in FIGURE 3 is adapted to provide isolation between the respective intermediate terminals 17 and 19 and 33 and 34 in the same magnitude as that achieved with respect to the embodiment shown in FIGURE 2 however the isolation is obtained with a simple resistor balance such as is required with respect to the embodiment shown in FIGURE 1.

While the present invention has been illustrated and described showing a common base, push-pull transistor configuration, this is not intended to be considered in a limiting sense. The inventive concepts of this invention applies equally well to all push-pull transistor configurations including common emitter, common collector, or combination circuits such as couplets or Darlington circuits.

While there has been shown and described what is presently considered to be the preferred embodiments of the subject invention it should be appreciated that modifications thereto will readily occur to those skilled in the art. It is not desired, therefore, that the invention be limited to those specific arrangements shown and described but it is to be understood that all equivalents, alterations, and modifications within the spirit and scope of the present invention are herein meant to be included.

We claim as our invention:

1. An amplifier circuit for electrical signals coupled to a source of input signals and having a source impedance ($R_s$) and operating into a load impedance ($R_L$) comprising in combination: a pair of input terminals connected to said source of input signals; a first hybrid coil network having a turns ratio ($N_1$) and having a pair of intermediate terminals; circuit means coupling said first hybrid coil network to said input terminals; a terminating impedance ($R_s'$) coupled to said hybrid coil network and having a value which is substantially proportional to $$\frac{R_s N_1^2}{4}$$

for providing relative isolation between said pair of intermediate terminals; signal translation means coupled to said first hybrid coil network and adapted to operate in push-pull relationship thereby; a second hybrid coil network having a turns ratio ($N_2$) and including another pair of intermediate terminals; circuit means coupling said second hybrid coil network to said signal translation means; a second terminating impedance ($R_L'$) having a value which is substantially proportional to $$\frac{R_L N_2^2}{4}$$

for providing relative isolation between said another pair of intermediate terminals; and a pair of output terminals coupled to said second hybrid coil network for providing an output signal across said load resistance $R_L$.

2. A balanced push-pull amplifier adapted to be coupled to a source of input signals having a source impedance $R_s$ and operating into a load resistance $R_L$ comprising in combination: a pair of input terminals connected across said source of input signals; first transformer means having a primary winding and a secondary winding with a center tap, said primary and said secondary winding having a turns ratio $n_p/n_s=N_1$; means for coupling said primary winding of said first transformer means to said input terminals; a first terminating impedance coupled to said center tap of said secondary winding and having a value functionally related to said source impedance $R_s$; first signal translation means coupled to one end of said secondary winding of said first transformer means; second signal translation means coupled to the opposite end of said secondary winding of said first transformer means; second transformer means having a primary winding and a secondary winding with a center tap and having a turns ratio $n_p/n_s=N_2$; circuit means for coupling one end of said secondary winding of said second transformer means to said first signal translation means; circuit means for connecting the opposite end of said secondary winding of said second transformer means to said second translation means; a second terminating impedance coupled to said center tap of said secondary winding of said second transformer means and having a predetermined value functionally related to said output impedance $R_L$; and a pair of output terminals connected across said primary winding of said second transformer means and adapted to be coupled to said load impedance $R_L$ for providing an output signal thereacross.

3. The amplifier circuit of claim 2 wherein: said first terminating impedance includes a resistance $R_S'$ which is functionally related to said source impedance $R_S$ and said turns ratio $N_1$ by the relationship:

$$R_S'=\frac{R_S N_1^2}{4}$$

4. The amplifier circuit of claim 2 wherein: said second terminating impedance includes a resistance $R_L'$ which is functionally related to said load impedance $R_L$ and said turns ratio $N_2$ by the following relationship:

$$R_L'=\frac{R_L N_2^2}{4}$$

5. A balanced push-pull amplifier adapted to be coupled to a source of input signals and operating into a load impedance comprising in combination: a pair of input terminals coupled to said source of input signals; a first multicoil hybrid network coupled to said pair of input terminals and adapted to have a pair of intermediate terminals; a first terminating impedance having a value functionally related to said source impedance for providing isolation between said pair of intermediate terminals; a first resstance connected to one of said pair of intermediate terminals; a second resistance coupled to the other of said pair of intermediate terminals; a first transistor means connected to said first resistance for receiving signals from said input source through said first multicoil hybrid network; second transistor means coupled to said second resistance for also receiving signals from said input source through said first-mentioned hybrid network, said first and said second transistor means additionally being adapted to operate in push-pull relationship from said first multicoil hybrid network; D.C. bias circuit means coupled to said first and said second transistor means for applying predetermined bias potentials thereto; a second multicoil hybrid network including a second pair of intermediate terminals, circuit means for coupling one of said second pair of intermediate terminals to said first transistor means; circuit means for coupling the other terminal of said second pair of intermediate terminals to said second transistor means; a second terminating impedance having a value functionally related to said load impedance for providing isolation between said second pair of intermediate terminals; said first and said second muticoil hybrid each comprising a first and a second inductor device, each including a plurality of windings inductively coupled together; circuit means for connecting one of said plurality of windings of said first and said second inductor device together in series to a first pair of terminals; circuit means for connecting another winding of said first and said second inductor device together in series to a respective said first and said second terminating impedance; circuit means coupling still another winding of said first inductor device to a first terminal of said pair of intermediate terminals; and circuit means coupling still another winding of said second inductor device to the other terminal of said pair of intermediate terminals; and output means coupled to said second multicoil hybrid network and adapted to be connected to said load impedance for providing an output signal thereacross.

6. A balanced push-pull amplifier adapted to be coupled to a source of input signals and operating into a load impedance comprising in combination: a pair of input terminals coupled to said source of input signals; a first multicoil hybrid network coupled to said pair of input terminals and adapted to have a pair of intermediate terminals; a first terminating impedance having a value functionally related to said source impedance for providing isolation between said pair of intermediate terminals; a first resistance connected to one of said pair of intermediate terminals; a second resistance coupled to the other of said pair of intermediate terminals; a first transistor means connected to said first resistance for receiving signals from said input source through said first multicoil hybrid network; second transistor means coupled to said second resistance for also receiving signals from said input source through said first-mentioned hybrid network, said first and said second transistor means additionally being adapted to operate in push-pull relationship from said first multicoil hybrid network; D.C. bias circuit means coupled to said first and said second transistor means for applying predetermined bias potentials thereto; a second multicoil hybrid network including a second pair of intermediate terminals, circuit means for coupling one of said second pair of intermediate terminals to said first transistor means; circuit means for coupling the other terminal of said second pair of intermediate terminals to said second transistor means; a second terminating impedance having a value functionally related to said load impedance for providing isolation between said second pair of intermediate terminals; said first multicoil hybrid comprising a first and a second inductor device each having at least three windings inductively coupled together; circuit means for connecting one of said three windings of said first and said second inductor device together in series across said input terminals; circuit means for connecting another winding of said first and said second inductor device together in series across said first terminating impedance; circuit means coupling the third winding of said first inductor device to a first terminal of said first pair of intermediate terminals; circuit means coupling the third winding of said second inductor device to a second terminal of said first pair of intermediate terminals; and output means coupled to said second multicoil hybrid network and adapted to be connected to said load impedance for providing an output signal thereacross.

7. A balanced push-pull amplifier adapted to be coupled to a source of input signals and operating into a load impedance comprising in combination: a pair of input terminals coupled to said source of input signals; a first multicoil hybrid network coupled to said pair of input terminals and adapted to have a pair of intermediate terminals; a first terminating impedance having a value functionally related to said source impedance for providing isolation between said pair of intermediate terminals; a first resistance connected to one of said pair of intermediate terminals; a second resistance coupled to the other of said pair of intermediate terminals; a first transistor means connected to said first resistance for receiving signals from said input source through said first multicoil hybrid network; second transistor means coupled to said second resistance for also receiving signals from said input source through said first-mentioned hybrid network, said first and said second transistor means additionally being adapted to operate in push-pull relationship from said first multicoil hybrid network; D.C. bias circuit means coupled to said first and said second transistor means for applying predetermined bias potentials thereto; a second multicoil hybrid network including a second pair of intermediate terminals, circuit means for coupling one of said second pair of intermediate terminals to said first transistor means; circuit means for coupling the other terminal of said second pair of intermediate terminals to said second transistor means; a second terminating impedance having a value functionally related to said load impedance for providing isolation between said second pair of intermediate terminals; said second multicoil hybrid comprising a first and a second inductor device including at least three windings inductively coupled together; circuit means for connecting a first winding of said three windings of said first and said second inductor device together in series across said output terminals; circuit means for connecting a second winding of said three windings of said first and said second inductor device together in series across said second terminating device; circuit means coupling the third winding of said three windings of said first inductor device to a first terminal of said second pair of intermediate terminals; circuit means coupling the third winding of said second inductor device to a second terminal of said second pair of intermediate terminals; and output means coupled to said second multicoil hybrid network and adapted to be connected to said load impedance for providing an output signal thereacross.

References Cited

UNITED STATES PATENTS

| | | | |
|---|---|---|---|
| 2,680,160 | 6/1954 | Yaeger | 330—15 |
| 2,691,075 | 10/1954 | Schwartz | 330—15 |
| 3,101,453 | 8/1963 | Simpson et al. | 330—15 X |
| 3,317,849 | 5/1967 | Smith-Vaniz | 330—21 |

OTHER REFERENCES

Electronic design, vol. 12, No. 5, p. 58 (330–15).

ROY LAKE, *Primary Examiner.*

E. C. FOLSOM, *Assistant Examiner.*